(12) United States Patent
Forbes et al.

(10) Patent No.: US 11,227,076 B2
(45) Date of Patent: Jan. 18, 2022

(54) METHOD AND SYSTEM FOR DESIGNING AN ELECTRICITY DISTRIBUTION NETWORK

(71) Applicant: BIARRI NETWORKS PTY LTD, Hendra (AU)

(72) Inventors: Joseph Patrick Forbes, Sandringham (AU); Lois Elenid Lambeth, Corwen (GB)

(73) Assignee: BIARRI NETWORKS PTY LTD, Hendra (AU)

( * ) Notice: Subject to any disclaimer, the term of this patent is extended or adjusted under 35 U.S.C. 154(b) by 665 days.

(21) Appl. No.: 16/066,826

(22) PCT Filed: Oct. 31, 2016

(86) PCT No.: PCT/AU2016/051030
§ 371 (c)(1),
(2) Date: Jun. 28, 2018

(87) PCT Pub. No.: WO2017/124132
PCT Pub. Date: Jul. 27, 2017

(65) Prior Publication Data
US 2019/0012408 A1    Jan. 10, 2019

(30) Foreign Application Priority Data

Jan. 22, 2016    (AU) ................................ 2016900203

(51) Int. Cl.
*H02J 3/00*       (2006.01)
*G06F 30/13*      (2020.01)
(Continued)

(52) U.S. Cl.
CPC ............ *G06F 30/13* (2020.01); *G06Q 10/04* (2013.01); *G06Q 50/06* (2013.01); *H02J 3/00* (2013.01);
(Continued)

(58) Field of Classification Search
CPC .. H02J 3/00; H02J 3/38; H02J 13/0006; H02J 13/00004; H02J 4/00; H02J 13/0062;
(Continued)

(56) References Cited

U.S. PATENT DOCUMENTS 5,329,464 A     7/1994  Sumic et al.
2009/0157573 A1*  6/2009  Anderson ............... G06N 20/00
                                                       706/12

(Continued)

FOREIGN PATENT DOCUMENTS

CN    102254242    11/2011
CN    103065040     4/2013
(Continued)

OTHER PUBLICATIONS

Paiva et al. Integral Planning of Primary-Secondary Distribution Systems Using Mixed Integer Linear Programming IEEE Transactions On Power Systems, vol. 20, No. 2, May 2005 (Year: 2005).*

(Continued)

*Primary Examiner* — Justin C Mikowski
*Assistant Examiner* — Cuong V Luu
(74) *Attorney, Agent, or Firm* — Barnes & Thornburg LLP; G. Peter Nichols (57) ABSTRACT

A system and method for designing an electricity distribution network in a geographic area includes receiving design inputs that include data indicative of locations of one or more substations, a location of at least one zone substation, how much power is required by the substations, a supply capacity of the zone substation, and data indicative of a maximum allowed number of outgoing feeders that can be supported by the zone substation; receiving or accessing architecture rules dictating minimum requirements of the electricity distribution network; electronically generating design outputs by determining a plurality of paths using the (Continued)

design inputs, the architecture rules and a linear optimisation function subject to linear and integer constraints, such that a total length of the paths is minimized, wherein the design outputs include the plurality of paths; and electronically outputting the design outputs.

17 Claims, 7 Drawing Sheets

(51) Int. Cl.
*G06Q 50/06* (2012.01)
*G06Q 10/04* (2012.01)

(52) U.S. Cl.
CPC ............ *H02J 3/005* (2013.01); *H02J 2203/20* (2020.01); *Y02E 60/00* (2013.01); *Y04S 40/20* (2013.01)

(58) Field of Classification Search
CPC .... H02J 2310/12; H02J 3/36; H02J 13/00007; H02J 9/04; H02J 13/0089; H02J 2203/10; G06Q 50/06
See application file for complete search history.

(56) References Cited

U.S. PATENT DOCUMENTS

| | | | |
|---|---|---|---|
| 2012/0130683 A1 | 5/2012 | Andoji et al. | |
| 2012/0136638 A1 | 5/2012 | Deschamps et al. | |
| 2015/0051744 A1* | 2/2015 | Mitra | G06N 5/00 700/286 |
| 2020/0186193 A1* | 6/2020 | Hansell | H02J 13/00034 |

FOREIGN PATENT DOCUMENTS

| | | |
|---|---|---|
| CN | 103116865 | 5/2013 |
| CN | 103514570 | 1/2014 |
| CN | 103956744 | 7/2014 |
| CN | 104182904 | 12/2014 |
| CN | 104734150 | 6/2015 |
| CN | 105046363 | 11/2015 |
| JP | 2005-045901 | 2/2005 |

OTHER PUBLICATIONS

Behnke et al. Secondary Network Distribution System Background and Issues Related to the Interconnection of Distributed Resources Technical Report NREL/TP-560-38079, Jul. 2005 (Year: 2005).*
Vasukumar Chenna Component Replacement Analysis Fro Electricity Distribution Systems Using Evolutionary Algorithms University of Texas at El Paso, DigitalCommon@UTEP, 2010 (Year: 2010).*
Peng et al. Feeder Reconfiguration in Distribution Networks Based on Convex Relaxation of OPF IEEE Transactions On Power Systems, vol. 30, No. 4, Jul. 2015 (Year: 2015).*
Costa et al., "Two-level network design with intermediate facilities: An application to electrical distribution systems," Omega, 39: 3-13 (2011).
International Preliminary Report On Patentability (IPRP), with Annexes, issued in Int'l App. No. PCT/AU2016/051030 (dated 2018).
Millar et al., "Urban Distribution Networks—Some General Planning Observations," CIRED 20th International Conference on Electricity Distribution, Prague, Paper 0266 (Jun. 8-11, 2009).
Brozek, "Hybrid algorithm for optimisation of *m*-loop electric power distribution networks—Modern electric power systems," IEE Proc.-Gener. Transm. Distrib., 151(2): 246-251 (Mar. 2004).
Supplementary Search Report & Opinion issued in EP App. No. 16885463.6 (dated May 2019).
English translation of Office Action issued in Appl. No. CN2016800796916 (dated Sep. 27, 2021).

* cited by examiner

METHOD AND SYSTEM FOR DESIGNING AN ELECTRICITY DISTRIBUTION NETWORK

This application claims priority to International Application No. PCT/AU2016/051030 filed Oct. 31, 2016 and to Australian Application No. 2016900203 filed Jan. 22, 2016; the entire contents of each is incorporated herein by reference.

RELATED APPLICATION

This application is based on and claims the benefit of the filing and priority dates of AU patent application no. 2016900203 filed 22 Jan. 2016, the content of which as filed is incorporated herein by reference in its entirety.

TECHNICAL FIELD

The present invention relates to a method and system for designing an electricity distribution network, in particular—but not exclusively—for supplying electrical power to premises in a 'greenfield' area, that is, a geographic area that has no existing utility infrastructure.

BACKGROUND

Electricity distribution networks are typically deployed aerially (i.e. raised) and/or underground, with some components on the ground. They are usually operated in 'tiers', each tier having a specific purpose and operating according to specific rules. In one example, an electricity distribution network may be composed of three such tiers. Though terminology varies, these are commonly:
1. a transmission network, designed to transport large amounts of power over long distances, operating in some countries at—for example—132 kV; serves zone substations;
2. a 'medium or high voltage' distribution network, operating in some countries at—for example—11 kV or 22 kV; connects zone substations to substations; and
3. a 'low voltage' distribution network, operating in some countries at—for example—400 V; connects substations to premises.

Conversion between tiers is performed with transformers. A transformer that converts the electrical supply from the second tier to the third tier (e.g. from 11 kV or 22 kV to 400 V) is referred to herein as a substation.

The second tier (e.g. 11 kV or 22 kV) distribution networks usually comprise a 'grid' (or 'mesh') of copper cables, operated as 'trees'. These trees constitute a subset of the grid, and are termed 'feeder trees' because they feed the electricity from a higher-voltage substation to one or more substations. These feeder trees are created within the grids by opening switches at specific locations in the grid, the switches usually being located next to a substation or as a part of the substation's infrastructure. The switches are opened and closed in order to control the flow of electricity through the distribution network. For example, there may be two routes for electrical flow from a zone substation to a substation, each route including respective switches A and B. When A is open, the electricity flows from the zone substation to the substation through switch B. If switch B is open, electricity flows from the zone substation to the substation through A. If electricity is to be supplied, switches A and B (in this example) cannot be open at the same time, and neither can be closed at the same time.

Such a network may also be described in terms of a 'physical network', being the aforementioned mesh comprising the entire set of connections, or in terms of an 'operational network', comprising the trees (or feeder trees) within the mesh that are active by virtue of switch settings.

Figure 1A:
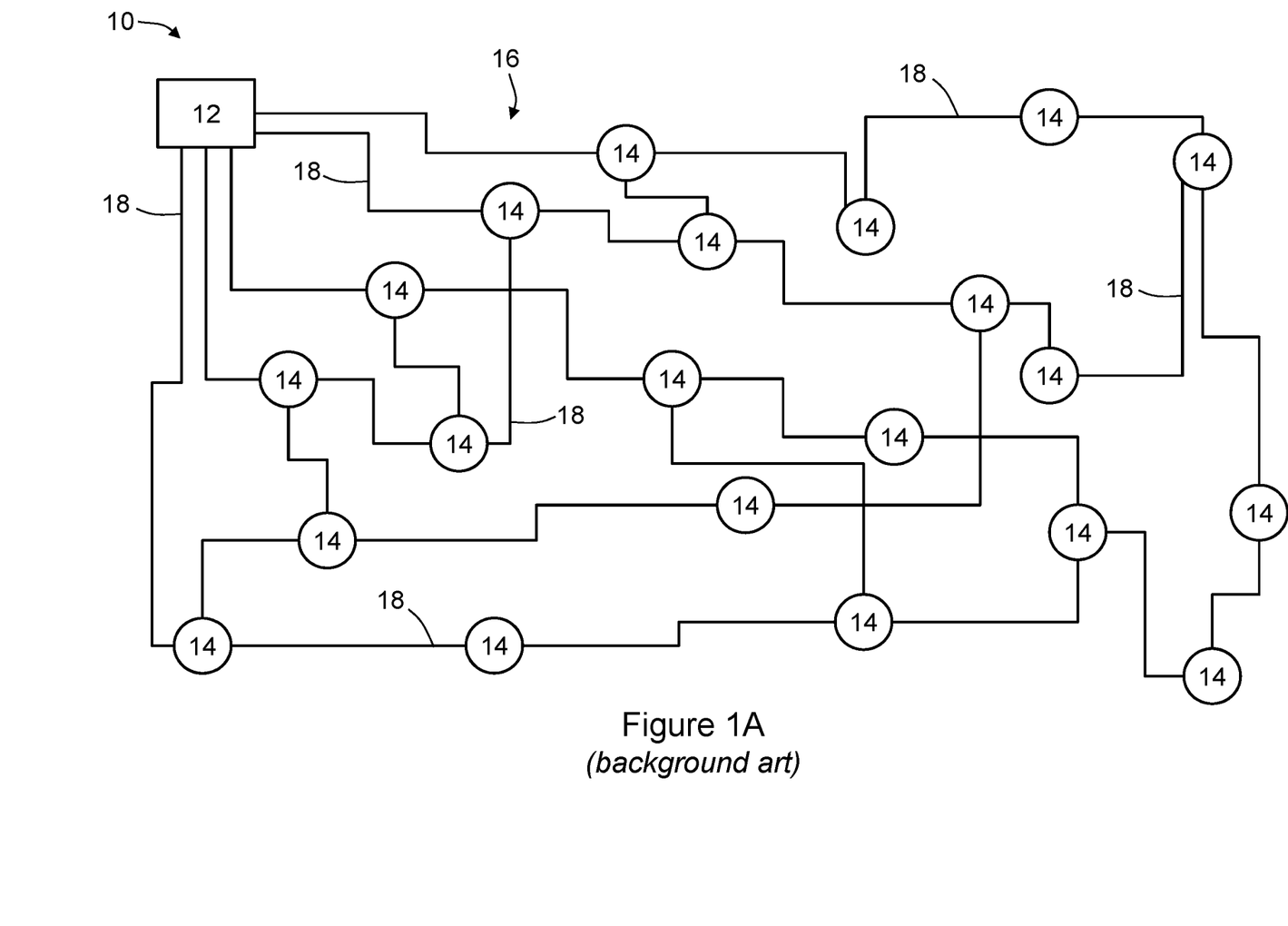
FIGS. 1A and 1B are schematic diagrams of an electricity distribution network according to the background art.

FIG. 1A is a schematic view of a notional electricity distribution network 10 (of the second tier) according to the background art. Referring to FIG. 1, network 10 has a grid topology, and includes a zone substation 12, a plurality of substations 14, and a grid 16 of cables 18 (of which only a selection are indicated with reference numerals). Cables 18 connect zone substation 12 to a subset of the substations 14, and each of substations 14 to typically two other substations 14.

Temporary power fluctuations or supply interruptions can occur owing to i) planned or emergency maintenance work, ii) unforeseen failure of equipment, or iii) damage to the network caused by trees or storms. A grid is employed rather than trees in order to minimise such disruptions, or to maximise the network reliability. Electricity can be rerouted in response to planned or unplanned service interruptions to service, changed service priorities or otherwise; this is done by selectively opening and closing switches in the network and hence modifying the operating network feeder trees. An as-built physical network typically includes a level of redundancy, in that—in any particular switching arrangement—some connections will be unused (and hence termed 'cross-connections'), but may be employed when disruption compromises one or more of the previously employed connections. That is, electricity may be re-routed along some or all of the previously unused connections in order to maintain supply; this is why each of substations 14 is connected to at least two other substations 14.

The cross connections are thus the physical parts of the network that are not used operationally, but which dictate the degree of meshing within the physical network, or between the physical networks across two or more zone substations.

Figure 1B:
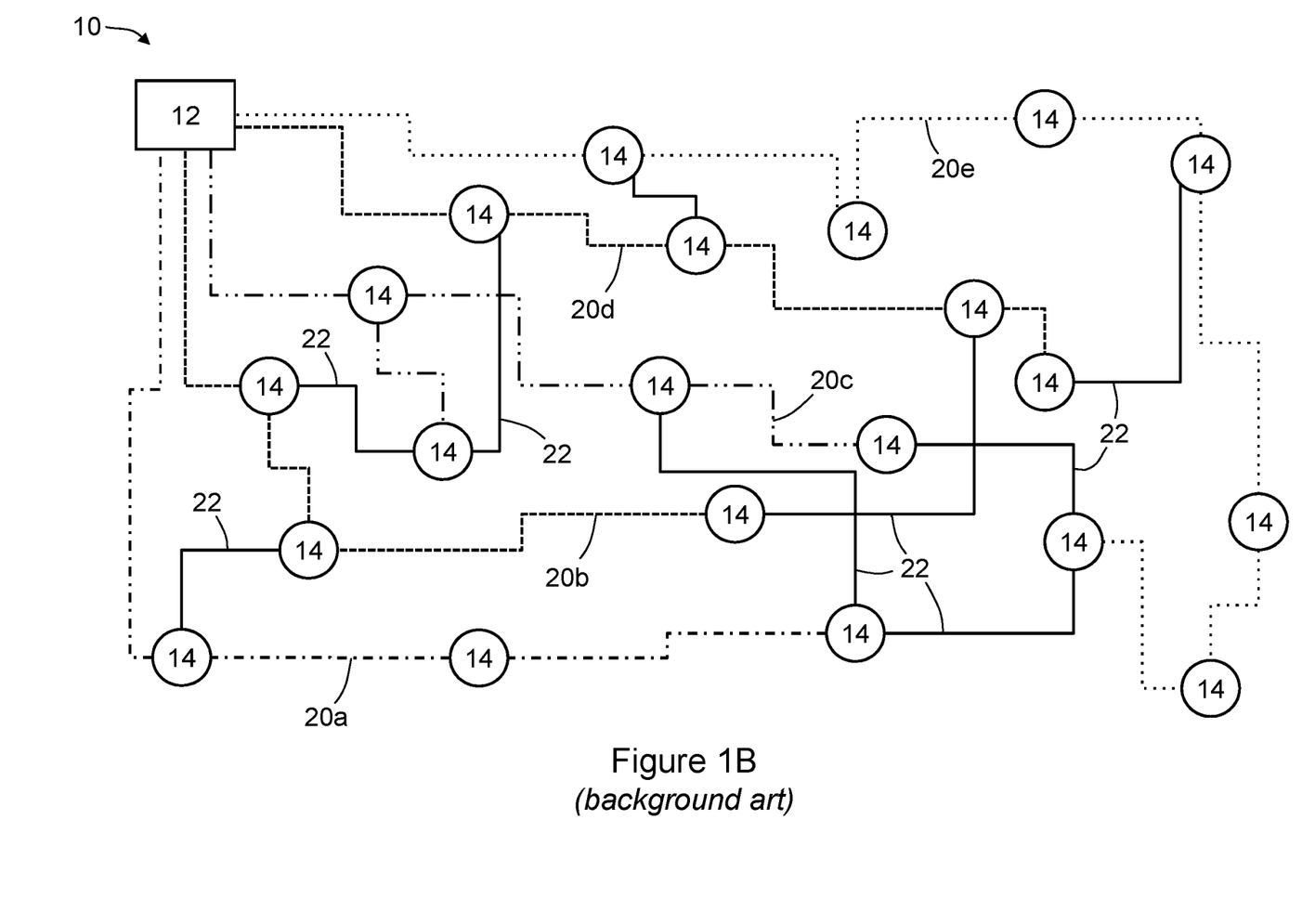

FIG. 1B is a view of network 10, showing five feeder trees 20a, 20b, 20c, 20d, 20e (each in a different line-type). The five feeder trees 20a, 20b, 20c, 20d, 20e are defined within network 10 by suitable switching of Substations 14. Cables 22 are those that, owing to that switching, do not transmit electricity at present and are hence currently 'cross-connections'; they are depicted by solid lines.

At least some existing networks are designed manually, which makes the design process time-consuming, adds cost to the subsequent implementation, and in particular makes these networks vulnerable to being non-compliant.

SUMMARY OF THE INVENTION

According to a first broad aspect, the invention provides a computer-implemented method of designing (that is, of generating a design of) an electricity distribution network for a geographic area, the method comprising:
  electronically receiving design inputs comprising data indicative of locations of one or more substations (and of which may be proposed or actual) for serving electricity to the geographic area, data indicative of a location of at least one zone substation for serving electricity to the substations, data indicative of how much power is required by the substations, data indicative of a supply capacity of the zone substation, and data indicative of a maximum allowed number of outgoing feeders that can be supported by the zone substation;

electronically receiving or accessing architecture rules dictating minimum requirements of the electricity distribution network;

electronically generating design outputs by determining a plurality of paths, at least one of the paths being between the zone substation and one or more of the substations and at least some of the paths being between respective pluralities of the substations, using the design inputs, the architecture rules and a linear optimisation function subject to linear and integer constraints, such that a total length of the paths is minimized, wherein the design outputs comprise the plurality of paths; and electronically outputting the design outputs.

In one embodiment, the method includes generating the design outputs in a manner that includes redundancy. In another, the method further comprises modifying the design outputs to include redundancy.

In an embodiment, the design inputs further comprise data indicative of locations of one or more surrounding substations, the surrounding substations being provided with electricity by one or more other zone substations, and how many connections each of the surrounding substation has.

At least some of the paths may be between one or more of the substations and one or more of the surrounding substations.

The architecture rules may comprise any one or more of:
i) all of the substations must be served with electricity;
ii) a total power that can be supplied per feeder of the electricity distribution network must not exceed a predefined maximum;
iii) a number of feeders of the electricity distribution network connected to the zone substation must not exceed a predefined maximum;
iv) a power that can be supplied by the zone substation must not exceed a predefined maximum;
v) a feeder of the electricity distribution network can branch at substations only;
vi) each of the substations must have a predefined maximum degree of active connections; and
vii) every feeder of the electricity distribution network must connect to a specified number of other unique feeders outside a common zone substation, wherein the other unique feeders may belong to the electricity distribution network or to another network.

In certain embodiments, the constraints comprise any one or more of:
i) a maximum path constraint that constrains the number of paths coming out of the zone substation not to exceed a predefined maximum;
ii) a supply capacity constraint that constrains power outputted by (or an amount of electricity flowing out of) the zone substation not to exceed the supply capacity of the zone substation;
iii) a substation service constraint that constrains the number of paths that serve a substation to a predefined maximum (e.g. 1);
iv) a substation output path constraint that constrains the number of paths going out from a substation to be no more than a predefined maximum (e.g. 2);
v) a path capacity constraint that constrains the flow on a respective path to not exceed the capacity of the respective path, if the respective path is used;
vi) a power conservation constraint that constrains the difference in the power received by a respective substation and the power outputted by the respective substation to be equal to the power consumed at the respective substation;
vii) a substation degree constraint that constrains a substation to have a predefined number or range of degrees (e.g. at least degree 2 and at most degree 3);
viii) a surrounding substation constraint that constrains the surrounding substations to be connected to no more than a predefined maximum (e.g. twice);
ix) a zone substation feeder constraint that constrains the number of feeders for each zone substation not to exceed a specified maximum;
x) a cross-connection constraint that constrains a cross-connection between two feeders to be counted if a path between the two feeders is used and bought; and
xi) a feeder connection constraint that constrains every feeder to be connected to at least a specified number of other feeders whether connected to the zone substation or to other zone substations.

The method may include outputting the design outputs as a map or data indicative of a map.

According to a second broad aspect, the invention provides a system for designing (that is, of generating a design of) an electricity distribution network for a geographic area, the system comprising:

an input for receiving design inputs comprising data indicative of locations of one or more substations for serving electricity to the geographic area, data indicative of a location of at least one zone substation for serving electricity to the substations, data indicative of how much power is required by the substations, data indicative of a supply capacity of the zone substation, and data indicative of a maximum allowed number of outgoing feeders that can be supported by the zone substation;

architecture rules dictating minimum requirements of the electricity distribution network;

an optimisation engine arranged to generate design outputs by determining a plurality of paths, at least one of the paths being between the zone substation and one or more of the substations and at least some of the paths being between respective pluralities of the substations, using the design inputs, the architecture rules and a linear optimisation function subject to linear and integer constraints, such that a total length of the paths is minimized, wherein the design outputs comprise the plurality of paths; and an output for outputting the design outputs.

In an embodiment, the optimisation engine is arranged to generate the design outputs in a manner that includes redundancy. In another embodiment, the system further comprises a redundancy engine arranged to modify the design outputs to include redundancy.

The design inputs may further comprise data indicative of locations of one or more surrounding substations, the surrounding substations being provided with electricity by one or more other zone substations, and how many connections each of the surrounding substation has.

At least some of the paths may be between one or more of the substations and one or more of the surrounding substations.

The architecture rules may comprise any one or more of:
i) all of the substations must be served with electricity;
ii) a total power that can be supplied per feeder of the electricity distribution network must not exceed a predefined maximum;

iii) a number of feeders of the electricity distribution network connected to the zone substation must not exceed a predefined maximum;
iv) a power that can be supplied by the zone substation must not exceed a predefined maximum;
v) a feeder of the electricity distribution network can branch at substations only;
vi) each of the substations must have a predefined maximum degree of active connections; and
vii) every feeder of the electricity distribution network must connect to a specified number of other unique feeders outside a common zone substation, wherein the other unique feeders may belong to the electricity distribution network or to another network.

The system may comprise any one or more of:
i) a maximum path constrainer that constrains the number of paths coming out of the zone substation not to exceed a predefined maximum;
ii) a supply capacity constrainer that constrains power outputted by (or an amount of electricity flowing out of) the zone substation not to exceed the supply capacity of the zone substation;
iii) a substation service constrainer that constrains the number of paths that serve a substation to a predefined maximum (e.g. 1);
iv) a substation output path constrainer that constrains the number of paths going out from a substation to be no more than a predefined maximum (e.g. 2);
v) a path capacity constrainer that constrains the flow on a respective path to not exceed the capacity of the respective path, if the respective path is used;
vi) a power conservation constrainer that constrains the difference in the power received by a respective substation and the power outputted by the respective substation to be equal to the power consumed at the respective substation;
vii) a substation degree constrainer that constrains a substation to have a predefined number or range of degrees (e.g. at least degree 2 and at most degree 3);
viii) a surrounding substation constrainer that constrains the surrounding substations to be connected to no more than a predefined maximum (e.g. twice);
ix) a zone substation feeder constrainer that constrains the number of feeders for each zone substation not to exceed a specified maximum;
x) a cross-connection constrainer that constrains a cross-connection between two feeders to be counted if a path between the two feeders is used and bought; and
xi) a feeder connection constrainer that constrains every feeder to be connected to at least a specified number of other feeders whether connected to the zone substation or to other zone substations.

The output may be arranged to output the design outputs as a map or data indicative of a map.

According to a third broad aspect, the invention provides an electricity distribution network design, generated according to the method of the first broad aspect, or with the system of the second broad aspect. This aspect also provides an electricity distribution network, designed according to the method of the first broad aspect, or with the system of the second broad aspect.

According to a fourth broad aspect, the invention provides computer software, configured to control a computing device, when executed thereon, to implement the method of the first aspect. According to this aspect, there is also provided a computer-readable medium (such as a non-transitory computer-readable medium) comprising such computer software.

It should be noted that any of the various individual features of each of the above aspects of the invention, and any of the various individual features of the embodiments described herein including in the claims, can be combined as suitable and desired.

BRIEF DESCRIPTION OF THE DRAWINGS

In order that the invention can be more clearly ascertained, embodiments will now be described, by way of example, with reference to the accompanying drawings, in which.

DETAILED DESCRIPTION

Figure 2:
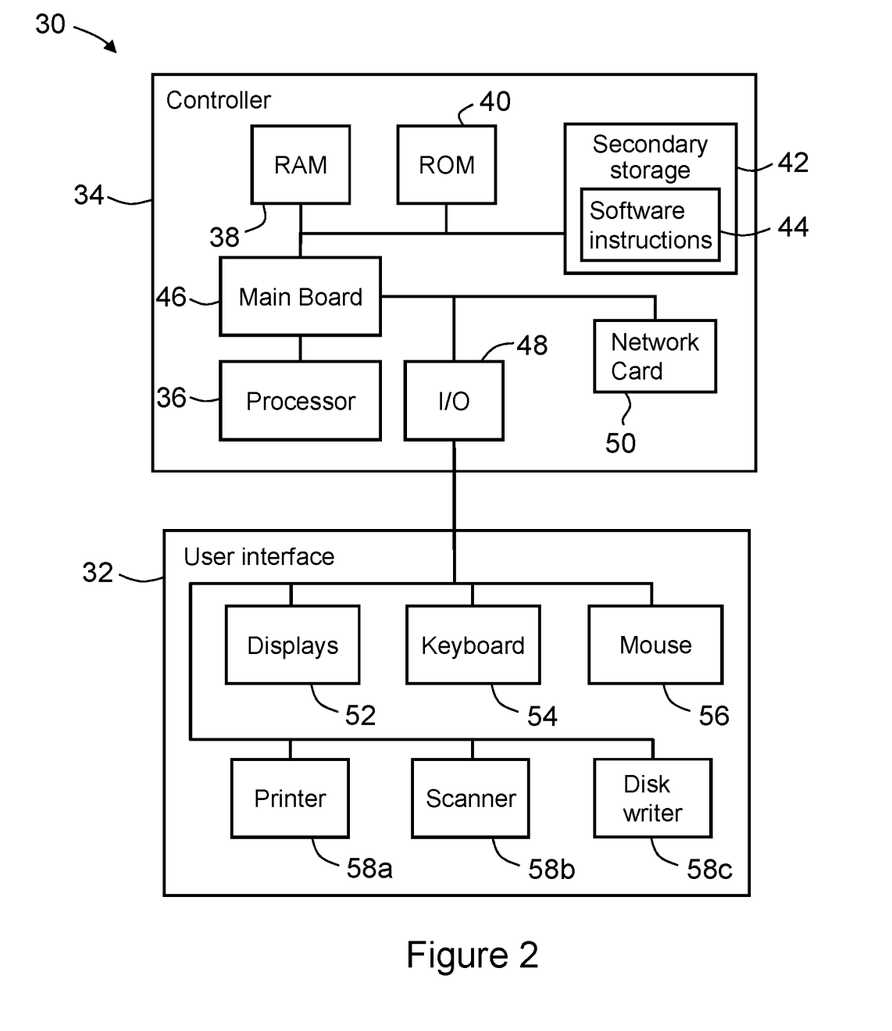
FIG. 2 is a schematic diagram of a system for designing an electricity distribution network according to an embodiment of the present invention.

According to an embodiment of the present invention, there is provided a system 30, as shown schematically in FIG. 2, for designing an electricity distribution network according to an embodiment of the present invention.

System 30 has a user interface 32 and a controller 34. Controller 34 includes a processor 36 (which may comprise one or more processors), RAM 38, ROM 40 and various secondary data storage 42 such as hard disk drives. Secondary storage 42 includes data and a software product comprising software instructions 44 for implementing the electricity distribution network design method of this embodiment, including for performing optimization and providing redundancy as is described below.

Software instructions 44 can update design outputs when desired network design inputs are varied by a user, typically in the form of a network designer. Software product 37 is also provided on an optical or magnetically readable medium, such as a CD-ROM 29, though it might also be provided in a ROM or other electronic circuit as firmware or provided over a distributed computer network such as the Internet. The software product 37 also includes instructions for the computational device 3 to implement the fibre optic network design method.

Processor 36 can access RAM 38, ROM 40 and secondary storage 42, and execute software instructions 44.

Controller 34 also includes a main board 46 with interfacing circuitry, an I/O board 48 (which may include a network support module, such as a LAN switch or Internet gateway), and a network card 50 (for communication with, for example, a telecommunications or computer network such as the Internet or an Ethernet). Main board 46 controls the flow of data and commands to and from user interface 32 via I/O 48, and the flow of data and commands to and from the telecommunications or computer network via network card 50.

User interface 32 is typically provided in or as a remote user computing device and various computer peripherals in communication with the other components of system 30 via a telecommunications network (not shown), such as the Internet or an Ethernet. Hence, the user typically receives any outputs remotely at user interface 32. User interface 32 includes one or more displays 52, a keyboard 54 a computer mouse 56, as well as peripherals in the form of a printer 58a (for converting files, spreadsheets and maps into paper hardcopy), a scanner 58b (for converting documents into electronic file format) and a disk reader/writer 58c (for reading and writing files, spreadsheets and maps from or to removable optical disks). Controller 34 can thus receive inputs either from user interface 32 or via network card 50, and output to user interface 32 or network card 50.

Figure 3:
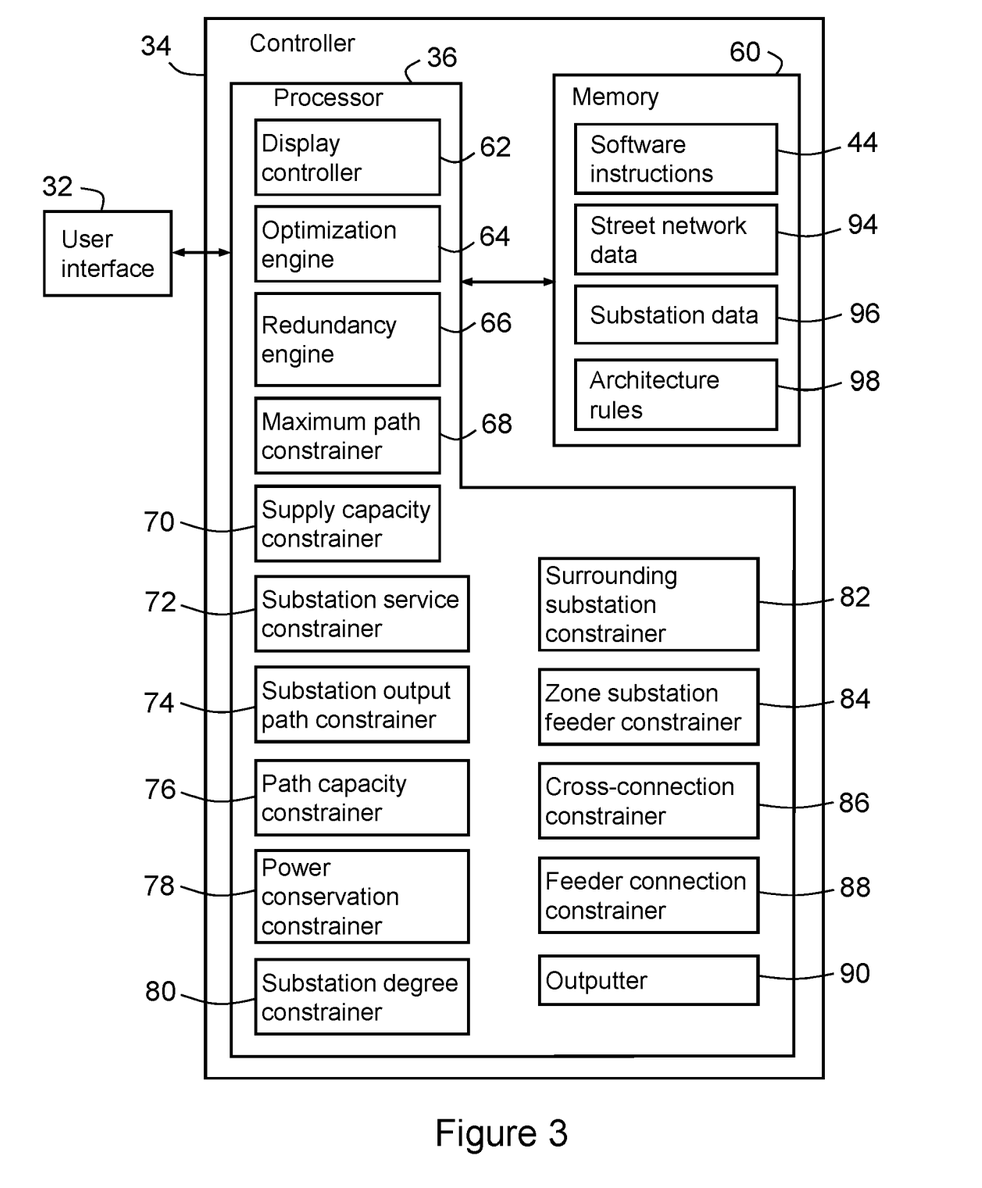
FIG. 3 is a schematic diagram of the controller of the system of FIG. 2.

FIG. 3 is a more detailed, schematic diagram of certain functional components of user interface 32 and controller 34. Referring to FIG. 3, controller 34 includes processor 36 (described above) and memory 60 (comprising RAM 38, ROM 40 and secondary storage 42).

Processor 36 includes various components that are implemented by software instructions 44, utilizing various hardware components of system 30, as will be appreciated by those skilled in the art. Thus, processor 36 includes a display controller 62, an optimization engine 64, a redundancy engine 66, a maximum path constrainer 68, a supply capacity constrainer 70, a substation service constrainer 72, a substation output path constrainer 74, a path capacity constrainer 76, a power conserver or power conservation constrainer 78, a substation degree constrainer 80, a surrounding substation constrainer 82, a zone substation feeder constrainer 84, a cross-connection constrainer 86, a feeder connection constrainer 88 and an outputter 90. The functions of these components are described below.

Memory 60 includes software instructions 44 (as described above), street network inputs 94, substation inputs 96 and architecture rules 98. System 30 is configured to receive geographic inputs indicative of a geographic area for which an electricity distribution network is to be designed. These geographic inputs include a specification of a street network within that geographic area: these are stored as street network inputs 94. Street network inputs 94 are described as specifying a 'street network', because cables are commonly laid along streets and the like. It should be understood, however, that street network inputs 94 can specify streets, easements (or land subject to an easement, such as for the purpose of siting cables), rights-of-way or the like, or any mixture thereof, where cables may be laid or strung. Indeed, in some cases the network may not follow streets, and street network inputs 94 may not specify any streets, but this is expected to be exceedingly rare; for convenience, therefore, the term 'street network inputs' is used even though in principle these inputs may not correspond to 'streets'.

System 30 is also configured to receive network infrastructure inputs or parameters, which are stored as substation inputs 96. In this embodiment, these include: (i) the locations of actual or proposed substations (referred to herein as 'substations') within the geographic area that should be served—in the ultimate design—with electricity and will serve as sources of electricity for the geographic area (or more precisely, for premises, etc, within the geographic area) and how much power these substations require (determined from the number and type of premises, and—if available—demand profiles), (ii) the location of a zone substation (referred to herein as the 'zone substation') that will provide electricity to the actual or proposed substations within the geographic area, the maximum allowed output power of the zone substation and the maximum allowed number of outgoing feeders that can be supported by the zone substation, and (iii) the locations of substations (referred to herein as 'surrounding substations') that are typically outside the geographic area and that are provided with electricity by another zone substation but which may provide redundancy, and how many connections each surrounding substation already has to the existing network of which the respective surrounding substation is a part.

Thus, the surrounding substations are points of access to the surrounding electricity (e.g. 22 kV) network and are already being served with electricity from another zone substation. Hence, they are already being served electricity, but may be used in the ultimate design to provide cross-connections for the purpose of redundancy.

Architecture rules 98 dictate certain minimum requirements of the ultimate design. These are selected or determined according to local requirements, but some will be essentially universal. For example, a first architecture rule of this embodiment is that all substations must be served with electricity. This is likely to be a universal rule, but it is conceivable—if unlikely—that in some cases it could be relaxed or omitted; for example, system 30 may be controlled to allow a specified maximum number of substations not to be served with electricity, to allow system 30 to identify solutions that require fewer substations.

Other architecture rules 98 of system 30 include:
each substation can be served from only 1 arc/direction in the operational network, but more than one in the physical network;
the total power that can be supplied per feeder must not exceed a specified maximum (e.g. 9200 kVA)
the number of feeders per zone substation (there being one or more zone substations) must not exceed a specified maximum (e.g. 20);
the power that can be supplied by a zone substation must not exceed a specified or predefined maximum (e.g. 90 MVA);
a feeder can branch at substations only;
each substation has a defined maximum degree of connections (e.g. 3, such as 1 arc in, 2 arcs out, in terms of the direction of electricity flow) in the physical network; and
to provide redundancy (as described below) every feeder of the ultimate network must connect to a specified number of other unique feeders (e.g. 3) (excluding the connection at a common zone substation), where the other unique feeders may belong to another network (including the 'surrounding substations').

The architecture rule 98 that a feeder can branch at substations only implies that no T-intersections are allowed. It is envisaged, however, that in other embodiments this rule may be omitted, or alternatively replaced by a rule stipulating that a feeder cannot branch at substations.

The ultimate design, once designed by system 30, may be outputted in a number of possible forms, including—for example—as geo-spatial file (This file may be in Keyhole Markup Language (KML) format) indicating the paths of copper cables required to create the design. Alternatively (though equivalently) system 30 may output the ultimate design as a map (whether in digital form, as a printout or to a display 52) that shows the paths of the required copper cables (for example, relative to the street network and/or substations). Optionally, system 30 may output the quantity of required copper cable (typically expressed in metres or other user-selected units). The gauge of the cable may be treated as fixed in such calculations but, optionally, system 30 may determine the appropriate gauge of each arc of cable (based on a table of cable gauge versus expected or determined maximum load, etc, as will be appreciated by those skilled in the art) and output the quantity of required copper cable of each gauge.

Display controller 62 controls the display on display 52 of user prompts and of the ultimate design (if the user controls system 30 to display the ultimate design, such as in map form, to display 52). Optimization engine 64 generates a solution for the feeder trees that provide an optimal design (i.e. with minimized required cable length), without consideration of cross-connections for redundancy, employing, in this embodiment, a mixed integer linear programming formulation.

In this embodiment, cable length and cost (whether regarded as the cost of the cable itself or the combined cost of cable and its installation) are treated as having a fixed relationship. In embodiments in which variation in cable gauge is permitted, and system 30 determines the appropriate gauge of cable for each arc, optimization engine 64 may generate a solution for the feeder trees that minimizes cable cost—taking into account the different cost of cable of different gauges. Further, in certain embodiments, cable cost includes installation cost and may vary according to type of installation (e.g. underground, aerial, etc), and optimization engine 64 may generate a solution for the feeder trees that minimizes cable cost (or simply 'cost')—hence taking that variation in installation cost into account (and optionally also the effect on cost of cable gauge, as described above).

Redundancy engine 66 then generates an optimal set of cross-connections, given the feeder trees generated by optimization engine 64. Redundancy may be added to the network or solution generated by optimization engine 64 by redundancy engine 66 into this network in a variety of ways, such as a greedy heuristic approach or by solving a second mixed integer linear programming formulation that minimises the cost of constructed paths such that the original solution is preserved. Other 'rules-of-thumb' approaches for adding redundancy may be followed.

It will also be appreciated by those skilled in the art that the functions of optimization and redundancy engines 64, 66 may if desired be combined such that the feeders of the ultimate design are generated with redundancy provided by cross-connections between these feeder trees and other trees (whether of the ultimate network or of the surrounding network(s)).

Optimization engine 64 is controlled or constrained in its operation by maximum path constrainer 68, supply capacity constrainer 70, substation service constrainer 72, substation output path constrainer 74, path capacity constrainer 76 and power conserver or power conservation constrainer 78 in the following manner. Maximum path constrainer 68 constrains the number of paths coming out of a zone substation (and hence the number of feeders) not to exceed a specified maximum.

Supply capacity constrainer 70 constrains the power outputted by a zone substation $z \in Z$ not to exceed the supply capacity of the zone substation.

Substation service constrainer 72 constrains the number of paths that serve a substation $s \in S$ to a predefined maximum of (in this embodiment) one path $p \in P$. Substation output path constrainer 74 constrains the number of paths going out from a substation to be no more than a predefined maximum of (in this embodiment) two. The combined effect of substation service constrainer 72 and substation output path constrainer 74 is that a substation can have at most degree three.

Path capacity constrainer 76 constrains the flow on a path $p \in P$ to not exceed the capacity of that path, if the path is used.

Power conserver or power conservation constrainer 78 constrains the difference in the power received by a substation and the power outputted by a substation to be equal to the power consumed at the substation.

Redundancy engine 66 is controlled or constrained in its operation by substation degree constrainer 80, surrounding substation constrainer 82, zone substation feeder constrainer 84, cross-connection constrainer 86 and feeder connection constrainer 88 in the following manner. Substation degree constrainer 80 constrains a substation to have at least degree 2 and at most degree 3; this means that if a substation already has degree 3 in the solution generated by optimization engine 64, no more connections can be made to that substation.

Surrounding substation constrainer 82 constrains the surrounding substations (i.e. those fed by feeders from zone substations outside the network being designed) to be connected to no more than twice. This assumes that a surrounding substation has exactly one existing connection to it already. Surrounding substation constrainer 82 may optionally be configured to operate according to input data concerning the surrounding substations—also optionally stored in substation data 96—that is indicative of actual numbers of existing surrounding substation connections, such that surrounding substation constrainer 82 can constrain the surrounding substations in the ultimate design to have a total degree of no more than 3.

Zone substation feeder constrainer 84 constrains the number of feeders for each zone substation not to exceed a specified acceptable maximum (a constraint that is comparable to that imposed by maximum path constrainer 68—for which reason these constrainers may be combined into a single integer if desired).

The cross-connections need to be counted so that architecture rules 98 can be enforced. For example, every feeder must connect to 3 other unique feeders so each feeder needs at least 3 cross-connections to other feeders. Hence, cross-connection constrainer 86 constrains redundancy engine 66 to treat a path between two feeders as a cross-connection only if the path meets the definition of a cross-connection.

Feeder connection constrainer 88 constrains every feeder from the solution generated by optimization engine 64 to be connected to at least a specified number N of other feeders, from either the set of feeders in that solution or from surrounding feeders connected to other zone substations.

Outputter 90 is configured to assemble the ultimate design in a requested form of output for outputting to the user.

The operation of optimization engine 64, redundancy engine 66, maximum path constrainer 68, supply capacity constrainer 70, substation service constrainer 72, substation output path constrainer 74, path capacity constrainer 76, power conserver or power conservation constrainer 78, substation degree constrainer 80, surrounding substation constrainer 82, zone substation feeder constrainer 84, cross-connection constrainer 86 and feeder connection constrainer 88 may be represented mathematically as follows. In the following:

S is the set of substations indexed by s

Z is the set of zone substations indexed by z $P^F$ is the set of all pairs of shortest paths $p_{zs}$ from each zone substation $z \in Z$ to each substation $s \in S$ $P^S$ is the complete set of all pairs of shortest paths $p_{st}$ from each substation $s \in S$ to $t \in S/\{s\}$. $p_{-s}$ are all the incoming paths at substation $s \in S$ and $p_{s-}$ are all the outgoing paths at substation $s \in S$ P is $P^F \cup P^S$ $C_p$ is the cost of building a cable along path $p \in P$ $A_z$ is the maximum power that zone substation $z \in Z$ can serve $F_z$ is the maximum number of feeders from zone substation $z \in Z$ V is the maximum power that a feeder can serve $D_s$ is the electricity demand for substation $s \in S$ $y_p \in \{0,1\}$ is 1 if path $p \in P$ is used (i.e. the design dictates that a cable be built along path p), 0 otherwise $x_p \geq 0$ is the 'flow' of electricity flowing along path $p \in P$.

Optimization engine 64 minimises:

$$\sum_{p \in P} C_p * y_p$$

In doing so, maximum path constrainer 68 implements:

$$\sum_{p_{z-} \in P} y_p \leq F_z \ \forall z \in Z \quad (1)$$

Supply capacity constrainer 70 implements:

$$\sum_{p_{z-} \in P} x_p \leq A_z \ \forall z \in Z \quad (2)$$

Substation service constrainer 72 implements:

$$\sum_{p_{-s} \in P} y_p = 1 \ \forall s \in S \quad (3)$$

Substation output path constrainer 74 implements:

$$\sum_{p_{s-} \in P} y_p \leq 2 \ \forall s \in S \quad (4)$$

Path capacity constrainer 76 implements:

$$x_p \leq V * y_p \ \forall p \in P \quad (5)$$

Power conserver 78 implements:

$$\sum_{p_{-s} \in P} x_p - \sum_{p_{s-} \in P} x_p = D_s \ \forall s \in S \quad (6)$$

These constraints may be varied (or some may be omitted) if it is desired to modify the solutions produced by system 30. If such modification is desired, generally small changes may be made to influence the results; for example, the constraint of equation (4) (implemented by substation output path constrainer 74) might be modified by adjusting the right-hand side, to increase (or decrease) the amount of branching allowed at each substation.

The design outputs of optimization engine 64 constitute a tree solution for how the network could be constructed and its electricity flow, without any redundancy, with specific outputs:

$Y_p$: the values of the y variables in the tree solution (viz. the paths that have been chosen for use)

$X_p$: the values of the x variables in the tree solution (viz. the flow of electricity on those paths)

According to this embodiment, in the operation of redundancy engine 66:

$S^T$ is the set of substations in the tree solution (S in the operation of optimization engine 64)

$S^S$ is the set of substations on surrounding feeders (served from another zone substation)

$F^T$ is the set of all feeders in the tree solution. $F^T = \{p_z \in P | z \in Z \text{ and } s \in S \text{ and } Y_{p_z} = 1\}$.

$F^S$ is the set of surrounding feeders (from other zone substations)

$F = F^T \cup F^S$ is the set of all feeders

P is now the set of all pairs of shortest paths p between zone substations and substations s, $t \in Z \cup S^T \cup S^S$ $P_i^c \subset P$ is the set of paths which connect feeder $i \in F^T$ to feeder $j \in F$ $T_s = \Sigma p_{s-}$, $p_{-s} \in P_p$ is the degree of substation $s \in S$ of zone substation $s \in Z$ in the tree solution $N_s^F \in F^T$ is the feeder of substation $s \in S$ in the tree solution $F_z$ is the maximum number of cables which can connect to or from zone substation $z \in Z$ (from formulation above)

N is the minimum number of unique feeders each feeder in $F^T$ must be connected to K is a penalty for connecting a feeder to itself $C_p{}'$ is the cost of constructing path $p \in P$. $C_p{}' = C_p \forall p_s - s \in S$ and $t \in S \cup Z$ and $N_s^F! = N_t^F \cdot C_p{}' = K * C_p$ otherwise $z_p \in \{0,1\}$ is 1 if path $p \in P$ is used as a cross-connection, 0 otherwise $a_i \in \{0, 1\}$ is 1 if feeder $i \in F$ is connected to feeder $j \in F$, 0 otherwise.

Redundancy engine 66 minimises:

$$\sum_{p \in P} C_p^C * z_p$$

In doing so, substation degree constrainer 80 implements:

$$\sum_{p_{-s} \in P} z_p + \sum_{p_{s-} \in P} z_p + T_s \geq 2 \ \forall s \in S \quad (7a)$$

and $$\sum_{p_{-s} \in P} z_p + \sum_{p_{s-} \in P} z_p + T_s \leq 3 \ \forall s \in S \quad (7b)$$

Surrounding substation constrainer 82 implements:

$$\sum_{p_{-s} \in P} z_p + \sum_{p_{s-} \in P} z_p \leq 2 \ \forall s \in S^S \quad (8)$$

Zone substation feeder constrainer 84 implements:

$$\sum_{p_{-z}\in P} z_p + \sum_{p_{z-}\in P} z_p + T_z \le F_z \ \forall\, z \in Z \qquad (9)$$

Cross-connection constrainer 86 implements:

$$a_i \ge z_p \ \forall\, i \in F^T, j \in F, p \in P_i^c \,|\, i\,!= j \qquad (10a)$$

and $$a_i \le \sum_{p\in P_i^c} z_p \ \forall\, i \in F^T, j \in F \,|\, i\,!= j \qquad (10b)$$

Feeder connection constrainer 88 implements:

$$\sum_{j\in F\,|\,i\,!=j} a_i \ge N \ \forall\, i \in F^T \qquad (11)$$

Again, as will be appreciated by those in the art, a number of these constraints may be varied or omitted from the above exemplary values, in order to modify the output of system 30, according to application and local requirements or for investigative purposes. For example, the penalty constraint imposed by the constant K is generally omitted.

Figure 4A:
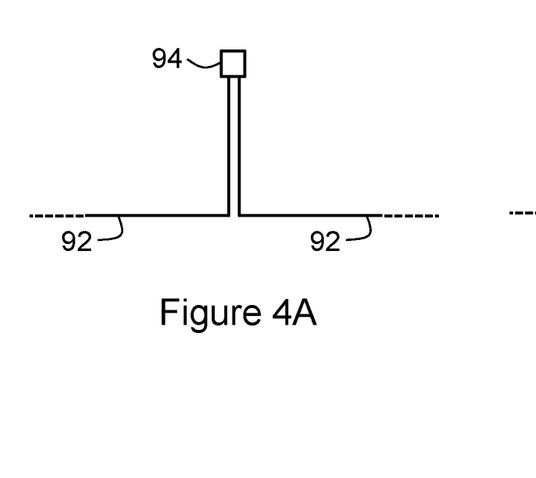
FIGS. 4A and 4B illustrate a T-intersection according to the system of FIG. 2.
Figure 4B:
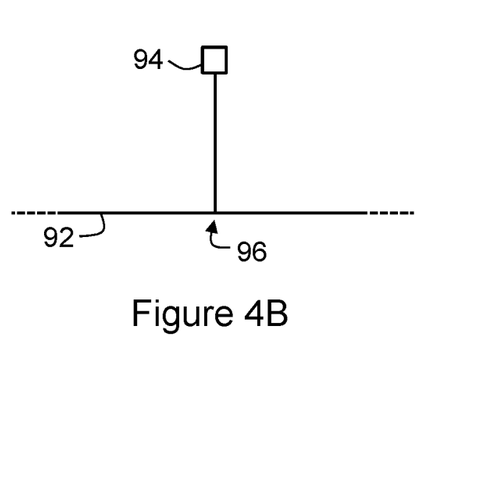

In addition, further constraints or rules may be added: for example, as mentioned above, the above example does not allow T-intersections, but this may be permitted or desired in some cases. FIGS. 4A and 4B illustrate what is meant by a T-intersection according to the present embodiment. Referring to FIG. 4A, the result of optimization may result in there being a cable 92 to a substation 94 and back. This outcome could, in many cases, be replaced—as shown in FIG. 4B—with a T-intersection 96, thereby eliminating cable duplication between the intersection and substation 94 and reducing the amount of cable required. Hence, it is envisaged that significant cost-savings could be available (in the ultimately implemented network) by allowing such T-intersections in the design process.

EXAMPLE

System 30 was tested by using it automatically to generate a design: system 30 was found to generate a solution costed at AU$318,000 less than a manually generated equivalent. This solution may not obey the so-called '3 MVA rule' as this rule is not embodied in system 30 (though two proposed ways to implement this rule are presented below). However, it should be noted that some of the rules that are obeyed by system 30 were not obeyed in the manual design. In some applications, this could make the solution generated by system 30 more expensive than a manual solution but more rigorous. For example, the manual design solution in this example had 22 substations on spurs while that generated by system 30 had none. A 'substation on a spur' is a substation with only one connection to a feeder. Spurs are related to T-intersections because the spurs come off a feeder at a T-intersection. As discussed above, a T-intersection is not allowed by architecture rules 98 because each feeder can only branch at a substation. Likewise, a 'substation on a spur' breaks architecture rules 98, which dictate that each substation must have at least two connections (and up to 3).

When the manual design of this example was made, these 'substations on spurs' were allowed.

However, if anything, these considerations make the cost saving obtained by system 30 in this example that much more noteworthy.

Table 1 compares the results of this example with those of the corresponding manual solution in quantitative terms.

TABLE 1

| Component | Exemplary Solution | Manual Solution | Difference |
| --- | --- | --- | --- |
| Number of feeders | 11 | 15 | 4 |
| Length of cable | 176,828 m | 177,226 m | 398 m |
| Cost of solution (at AU$800/m) | AU$141,462,400 | AU$141,780,800 | AU$318,400 |
| Time to find solution | 633 seconds | unknown | |

Table 2 compares the network architecture of this example with that of the corresponding manual solution.

TABLE 2

| Feature | Present example | Manual Solution | Notes |
| --- | --- | --- | --- |
| Number of feeders exceeding 9.2 MVA power limit | 0 | 2 | |
| Zone Sub within 90 MVA power supply limit | Yes | Yes | |
| Minimum degree of substations | 2 | 1 | |
| Number of degree 1 substations (spurs) | 0 | 22 | Not modelled in this example |
| Maximum degree of substations | 3 | 4 | |
| Number of substations with degree > 3 | 0 | 1 | |
| Number of T-intersections | 0 | 19 | |
| Number of feeders directly connected to 3 other distinct feeders | 11 out of 11 | 12 out of 15 | |
| Number of times 3 MVA rule not obeyed | unknown | unknown | Not modelled or counted in manual solution |

The solution in this example serves all of 365 substations, has 176,828 m of cable and was generated in 633 seconds.

Though the 3 MVA rule was not modelled, two possible ways of implementing the 3 MVA rule are proposed. Firstly, this could be done by partitioning a feeder into 3 MVA segments and requiring that there must be a cross-connection in each of the segments. Secondly, this could be done by tracing down the feeder from the zone substation, summing up the load on each substation, and requiring that there must be a cross-connection every x MVA, where x is less than or equal to 3, such that 3 MVA is not exceeded.

Figure 5A:
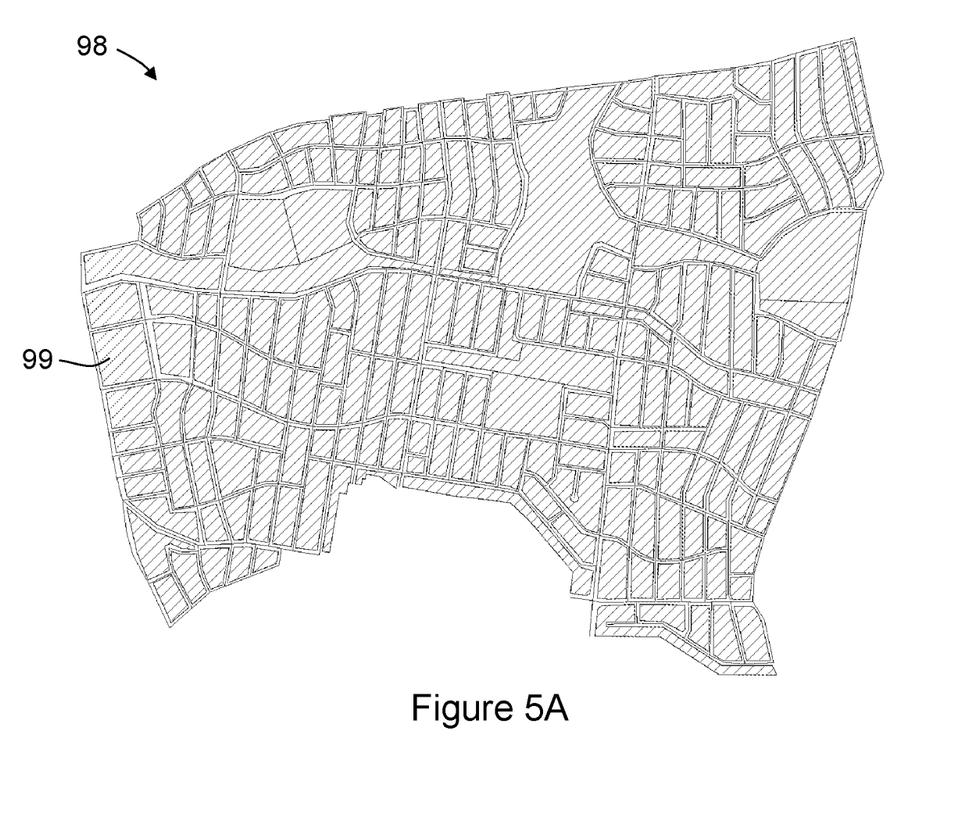
FIGS. 5A to 5C depict, respectively, exemplary geospatial data input for the system of FIG. 2, an exemplary electricity distribution network generated by the system of FIG. 2, and the superposition of this geospatial data and the generated electricity distribution network as outputted by the system of FIG. 2.
Figure 5B:
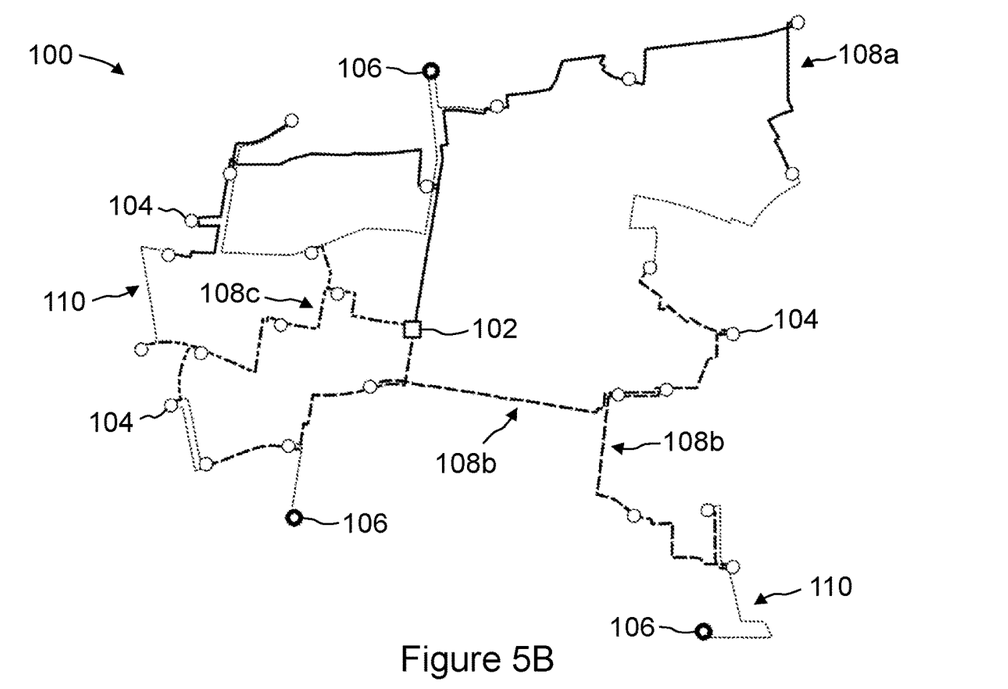
Figure 5C:
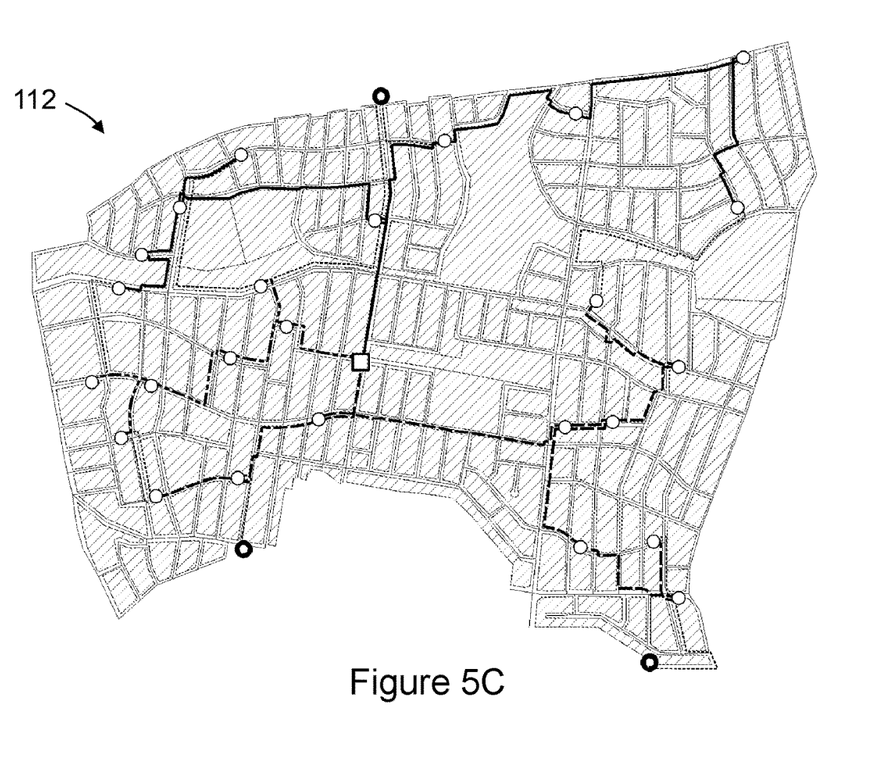

FIGS. 5A to 5C depict, respectively, exemplary geospatial data input for system 30, an exemplary electricity distribution network generated by system 30, and the superposition of this geospatial data and the generated electricity distribution network as outputted by system 30. These figures illustrate a simple example, prepared in order to aid comprehension.

Thus, FIG. 5A depicts exemplary geospatial data 98 inputted into system 30, geospatial data 98 comprising land parcels (shown as shaded polygons, such as at 99) and streets. The streets are represented in the form of the centrelines of the actual streets, and typically surround the land parcels. Geospatial data 98 constitutes the minimum input data for system 30, but—as will be apparent from the foregoing—other layers may be specified, as may be the relative costs for each network component, specific design rules, capacities, maximum number of feeders, maximum voltage drops, etc.

FIG. 5B depicts an electricity distribution network 100 generated by system 30 on the basis of geospatial data 98. Network 100 comprises a zone substation 102 (depicted as a square), new substations 104 (depicted as circles), existing peripheral substations 106 (depicted as heavy circles), three feeders (or feeder trees) 108a, 108b, 108c (depicted as solid lines, evenly dashed lines and unevenly dashed lines respectively), and cross connections 110 (depicted as dotted lines).

FIG. 5C is a superposition 112 of geospatial data 98 and generated electricity distribution network 100. System 30 may be operated to control outputter 90 to output a generated network in any suitable format, including those of FIGS. 5B and 5C.

Figure 6A:
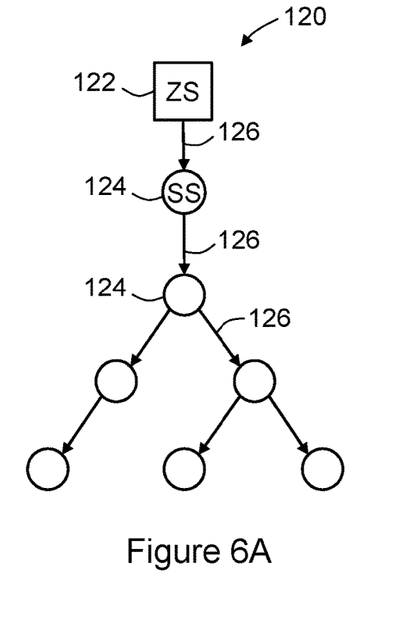
FIGS. 6A to 6C illustrate a first implementation of the 3 MVA rule according to an embodiment of the present invention.
Figure 6B:
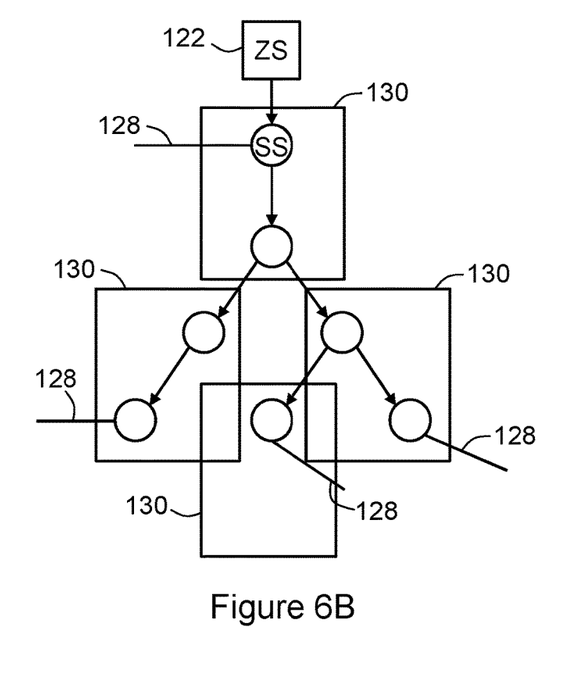
Figure 6C:
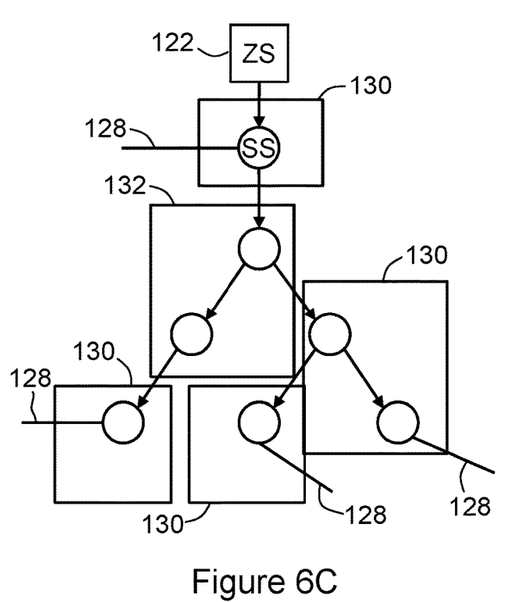

FIGS. 6A to 6C illustrate a first implementation of the 3 MVA rule according to an embodiment of the present invention. In FIGS. 6A to 6C, squares represent zone stations while circles represent substations; arrows represent cables. Referring to FIG. 6A, an exemplary feeder tree 120 includes a zone station 122 and a plurality of substations 124, connected by cables 126. Each substation is assumed to be 1.5 MVA. Referring to FIG. 6B, 3 MVA cross-connections 128 are added where required to satisfy the requirement of one cross-connection per 3 MVA partition 130.

However, it should be noted that the partitions should be defined with care to ensure that the 3 MVA cross-connection rule is obeyed. If not, the 3 MVA cross-connection rule may not be obeyed. For example, FIG. 6C illustrates an arrangement with a different set of partitions 130 defined: in partition 132, the 3 MVA cross-connection rule is not obeyed.

Figure 7:
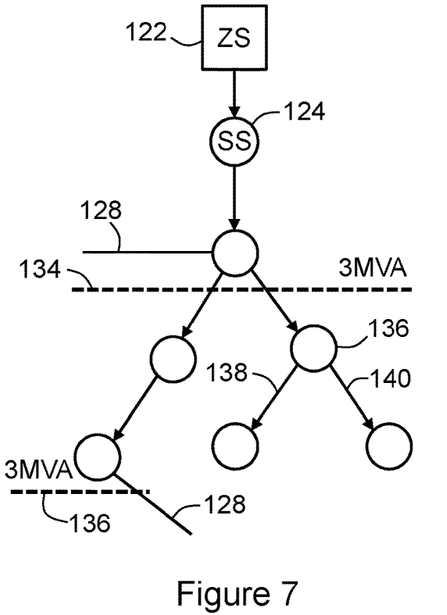
FIG. 7 illustrates a second implementation of the 3 MVA rule according to an embodiment of the present invention.

FIG. 7 illustrates a second implementation of the 3 MVA rule according to an embodiment of the present invention. In FIG. 7, a square is again used to represent a zone station while circles represent substations and arrows represent cables. As described above, in this implementation one traces down the feeder from zone substation 122, summing up the load on each substation 124. By each 3 MVA or less (such as at, say, 134 and 136), there must be a cross-connection 128. (Note that if, after branching at a substation (e.g. at substation 136 in this figure), summing of load does not occur along both branches (e.g. cables 138 and 140 in this figure), this approach may reduce to the first implementation.)

It will also be understood to those persons skilled in the art of the invention that many modifications may be made without departing from the scope of the invention.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It will also be understood that the reference to any prior art in this specification is not, and should not be taken as an acknowledgement or any form of suggestion that, the prior art forms part of the common general knowledge in any country.

The invention claimed is:

1. The computer-implemented method of designing an electricity distribution network for a geographic area, the method comprising:
   electronically receiving design inputs comprising data indicative of locations of one or more substations for serving electricity to the geographic area, data indicative of a location of at least one zone substation for serving electricity to the substations, data indicative of how much power is required by the substations, data indicative of a supply capacity of the zone substation, data indicative of a maximum allowed number of outgoing feeders that can be supported by the zone substation, and street network inputs specifying where cables may be laid or strung;
   electronically receiving or accessing architecture rules dictating minimum requirements of the electricity distribution network;
   electronically generating design outputs by determining a plurality of paths for laying or stringing cables to implement the electricity distribution network, at least one of the paths being between the zone substation and one or more of the substations and at least some of the paths being between respective pluralities of the substations, using the design inputs, the architecture rules and a linear optimisation function subject to linear and integer constraints, such that a total length of the paths is minimized, wherein the design outputs comprise the plurality of paths;
   subsequently electronically modifying the design outputs to include redundancy, wherein as a result of the modification, every feeder connects to a specified number of other unique feeders;
   electronically outputting the modified design outputs; and
   constructing the electricity distribution network according to the modified design outputs,
   wherein the design outputs are modified to include redundancy by minimising:

$$\sum_{p \in P} C_p^C * z_p$$

wherein p, P, $C_p^C$, and $z_p$ are defined from the design outputs according to:
$S^T$ is the set of substations in the tree solution of the design outputs
$S^S$ is the set of substations on surrounding feeders
$F^T$ is the set of all feeders in the tree solution
$F^T = \{p_{zs} \in P | z \in Z \text{ and } s \in S \text{ and } Y_{p_{zs}} = 1$
$F^S$ is the set of surrounding feeders
$F = F^T \cup F^S$ is the set of all feeders
P is now the set of all pairs of shortest paths $p_{st}$ between zone substations and substations s, $t \in Z \cup S^T \cup S^S$
$P_{ij}^c \subset P$ is the set of paths which connect feeder $i \in F^T$ to feeder $j \in F$
$T_s = \Sigma p_{s-}, p_{-s} \in PY_p$ is the degree of substation $s \in S$ of zone substation $s \in Z$ in the tree solution
$N_s^F \in F^T$ is the feeder of substation $s \in S$ in the tree solution
$F_z$ is the maximum number of cables which can connect to or from zone substation $z \in Z$
N is the minimum number of unique feeders each feeder in $F^T$ must be connected
K is a penalty for connecting a feeder to itself
$C_p'$ is the cost of constructing path $p \in P$; $C_p' = C_p \forall p_{st} - s \in S$ and $t \in S \cup Z$ and $N_s^F! = N_t^F \cdot C_p' = K * C_p$ otherwise $z_p \in \{0,1\}$ is 1 if path $p \in P$ is used as a cross-connection, 0 otherwise $a_{ij} \in \{0, 1\}$ is 1 if feeder $i \in F$ is connected to feeder $j \in F$, 0 otherwise.

2. The computer-implemented method according to claim 1, wherein the design inputs further comprise data indicative of locations of one or more surrounding substations, the surrounding substations being provided with electricity by one or more other zone substations, and how many connections each of the surrounding substation has, and wherein at least some of the paths are between one or more of the substations and one or more of the surrounding substations.

3. The computer-implemented method according to claim 1, wherein the architecture rules comprise any one or more of:
   i) all of the substations must be served with electricity;
   ii) a total power that can be supplied per feeder of the electricity distribution network must not exceed a predefined maximum;
   iii) a number of feeders of the electricity distribution network connected to the zone substation must not exceed a predefined maximum;
   iv) a power that can be supplied by the zone substation must not exceed a predefined maximum;
   v) a feeder of the electricity distribution network can branch at substations only;
   vi) each of the substations must have a predefined maximum degree of active connections; and
   vii) every feeder of the electricity distribution network must connect to a specified number of other unique feeders outside a common zone substation, wherein the other unique feeders may belong to the electricity distribution network or to another network.

4. The computer-implemented method according to claim 1, wherein the linear optimisation function is subject to constraints comprising any one or more of:
   i) a maximum path constraint that constrains the number of paths coming out of the zone substation not to exceed a predefined maximum;
   ii) a supply capacity constraint that constrains power outputted by the zone substation not to exceed the supply capacity of the zone substation;
   iii) a substation service constraint that constrains the number of paths that serve a substation to a predefined maximum;
   iv) a substation output path constraint that constrains the number of paths going out from a substation to be no more than a predefined maximum;
   v) a path capacity constraint that constrains the flow on a respective path to not exceed the capacity of the respective path, if the respective path is used;
   vi) a power conservation constraint that constrains the difference in the power received by a respective substation and the power outputted by the respective substation to be equal to the power consumed at the respective substation;
   vii) a substation degree constraint that constrains a substation to have a predefined number or range of degrees;
   viii) a surrounding substation constraint that constrains the surrounding substations to be connected to no more than a predefined maximum;
   ix) a zone substation feeder constraint that constrains the number of feeders for each zone substation not to exceed a specified maximum;
   x) a cross-connection constraint that constrains a cross-connection between two feeders to be counted if a path between the two feeders is used and bought; and
   xi) a feeder connection constraint that constrains every feeder to be connected to at least a specified number of other feeders whether connected to the zone substation or to other zone substations.

5. The computer-implemented method according to claim 4, wherein the substation service constraint constrains the number of paths that serve a substation to be one, and wherein the substation output path constraint constrains the number of paths going out from a substation to be no more than two.

6. The computer-implemented method according to claim 4, wherein the substation degree constraint constrains a substation to have at least degree 2 and at most degree 3.

7. The computer-implemented method according to claim 4, wherein the surrounding substation constraint constrains the surrounding substations to be connected to no more than twice.

8. The computer-implemented method according to claim 1, including outputting the design outputs as a map or data indicative of a map.

9. The method of claim 1, wherein the design outputs are modified to include redundancy accounting for one of more of:
   i) a substation degree constraint that constrains a substation to have a predefined number or range of degrees;
   ii) a surrounding substation constraint that constrains the surrounding substations to be connected to no more than a predefined maximum;
   iii) a zone substation feeder constraint that constrains the number of feeders for each zone substation not to exceed a specified maximum;
   iv) a cross-connection constraint that constrains a cross-connection between two feeders to be counted if a path between the two feeders is used and bought; and
   v) a feeder connection constraint that constrains every feeder to be connected to at least a specified number of other feeders whether connected to the zone substation or to other zone substations.

10. A system for designing an electricity distribution network for a geographic area, the system comprising:
    an input for receiving design inputs comprising data indicative of locations of one or more substations for serving electricity to the geographic area, data indicative of a location of at least one zone substation for serving electricity to the substations, data indicative of how much power is required by the substations, data indicative of a supply capacity of the zone substation, data indicative of a maximum allowed number of outgoing feeders that can be supported by the zone substation, and street network inputs specifying where cables may be laid or strung;
    architecture rules dictating minimum requirements of the electricity distribution network;
    an optimisation engine arranged to generate design outputs by determining a plurality of paths for laying or stringing cables to implement the electricity distribution network, at least one of the paths being between the zone substation and one or more of the substations and at least some of the paths being between respective pluralities of the substations, using the design inputs, the architecture rules and a linear optimisation function subject to linear and integer constraints, such that a total length of the paths is minimized, wherein the design outputs comprise the plurality of paths;

a redundancy engine arranged to receive the design outputs from the optimisation engine and to modify the design outputs to include redundancy, wherein as a result of the modification, every feeder connects to a specified number of other unique feeders; and an output for outputting the modified design outputs;

wherein redundancy engine is constrained, when including redundancy, according to one or more of:
i) a substation degree constrainer that constrains a substation to have a predefined number or range of degrees;
ii) a surrounding substation constrainer that constrains the surrounding substations to be connected to no more than a predefined maximum;
iii) a zone substation feeder constrainer that constrains the number of feeders for each zone substation not to exceed a specified maximum;
iv) a cross-connection constrainer that constrains a cross-connection between two feeders to be counted if a path between the two feeders is used and bought; and
v) a feeder connection constrainer that constrains every feeder to be connected to at least a specified number of other feeders whether connected to the zone substation or to other zone substation, and wherein the redundancy engine modifies the design outputs to include redundancy by minimising:

$$\sum_{p \in P} C_p^C * z_p$$

wherein p, P, $C_p^C$, and $z_p$ are defined from the design outputs according to:

$S^T$ is the set of substations in the tree solution of the design outputs $S^S$ is the set of substations on surrounding feeders $F^T$ is the set of all feeders in the tree solution $F^T = \{p_{zs} \in P | z \in Z \text{ and } s \in S \text{ and } Y_{p_{zs}} = 1$ $F^S$ is the set of surrounding feeders $F = F^T \cup F^S$ is the set of all feeders P is now the set of all pairs of shortest paths $p_{st}$ between zone substations and substations s, t∈Z∪$S^T$∪$S^S$ $P_{ij}^c \subset P$ is the set of paths which connect feeder i∈$F^T$ to feeder j∈F $T_s = \Sigma p_{s-}, p_{-s} \in P Y_p$ is the degree of substation s∈S of zone substation s∈Z in the tree solution $N_s^F \in F^T$ is the feeder of substation s∈S in the tree solution $F_z$ is the maximum number of cables which can connect to or from zone substation z∈Z N is the minimum number of unique feeders each feeder in $F^T$ must be connected K is a penalty for connecting a feeder to itself $C_p$' is the cost of constructing path p∈P; $C_p' = C_p \forall p_{st} - s \in S$ and t∈S∪Z and $N_s^F! = N_t^F \cdot C_p' = K * C_p$ otherwise $z_p \in \{0,1\}$ is 1 if path p∈P is used as a cross-connection, 0 otherwise $a_{ij} \in \{0, 1\}$ is 1 if feeder i∈F is connected to feeder j∈F, 0 otherwise and wherein the electricity distribution network for the geographic area is constructed according to design outputs of the system.

11. The system according to claim 10, wherein the design inputs further comprise data indicative of locations of one or more surrounding substations, the surrounding substations being provided with electricity by one or more other zone substations, and how many connections each of the surrounding substation has, and wherein at least some of the paths are between one or more of the substations and one or more of the surrounding substations.

12. The system according to claim 10, wherein the architecture rules comprise any one or more of:
i) all of the substations must be served with electricity;
ii) a total power that can be supplied per feeder of the electricity distribution network must not exceed a predefined maximum;
iii) a number of feeders of the electricity distribution network connected to the zone substation must not exceed a predefined maximum;
iv) a power that can be supplied by the zone substation must not exceed a predefined maximum;
v) a feeder of the electricity distribution network can branch at substations only;
vi) each of the substations must have a predefined maximum degree of active connections; and
vii) every feeder of the electricity distribution network must connect to a specified number of other unique feeders outside a common zone substation, wherein the other unique feeders may belong to the electricity distribution network or to another network.

13. The system according to claim 10, wherein the optimisation engine is constrained by one or more of:
i) a maximum path constrainer that constrains the number of paths coming out of the zone substation not to exceed a predefined maximum;
ii) a supply capacity constrainer that constrains power outputted by the zone substation not to exceed the supply capacity of the zone substation;
iii) a substation service constrainer that constrains the number of paths that serve a substation to a predefined maximum;
iv) a substation output path constrainer that constrains the number of paths going out from a substation to be no more than a predefined maximum;
v) a path capacity constrainer that constrains the flow on a respective path to not exceed the capacity of the respective path, if the respective path is used;
vi) a power conservation constrainer that constrains the difference in the power received by a respective substation and the power outputted by the respective substation to be equal to the power consumed at the respective substation;
vii) a substation degree constrainer that constrains a substation to have a predefined number or range of degrees;
viii) a surrounding substation constrainer that constrains the surrounding substations to be connected to no more than a predefined maximum;
ix) a zone substation feeder constrainer that constrains the number of feeders for each zone substation not to exceed a specified maximum;
x) a cross-connection constrainer that constrains a cross-connection between two feeders to be counted if a path between the two feeders is used and bought; and
xi) a feeder connection constrainer that constrains every feeder to be connected to at least a specified number of other feeders whether connected to the zone substation or to other zone substations.

14. The system according to claim 13, wherein the substation service constrainer constrains the number of paths that serve a substation to be one, and the substation output path constrainer constrains the number of paths going out from a substation to be no more than two.

15. The system according to claim 13, wherein the substation degree constrainer constrains a substation to have at least degree 2 and at most degree 3.

16. The system according to claim 13, wherein the surrounding substation constrainer constrains the surrounding substations to be connected to no more than twice.

17. The system according to claim 10, wherein the output is arranged to output the design outputs as a map or data indicative of a map.

* * * * *